AUTOMATIC GAIN CONTROL SYSTEM WITH NOISE VARIABLE THRESHOLD
Filed Feb. 2, 1967
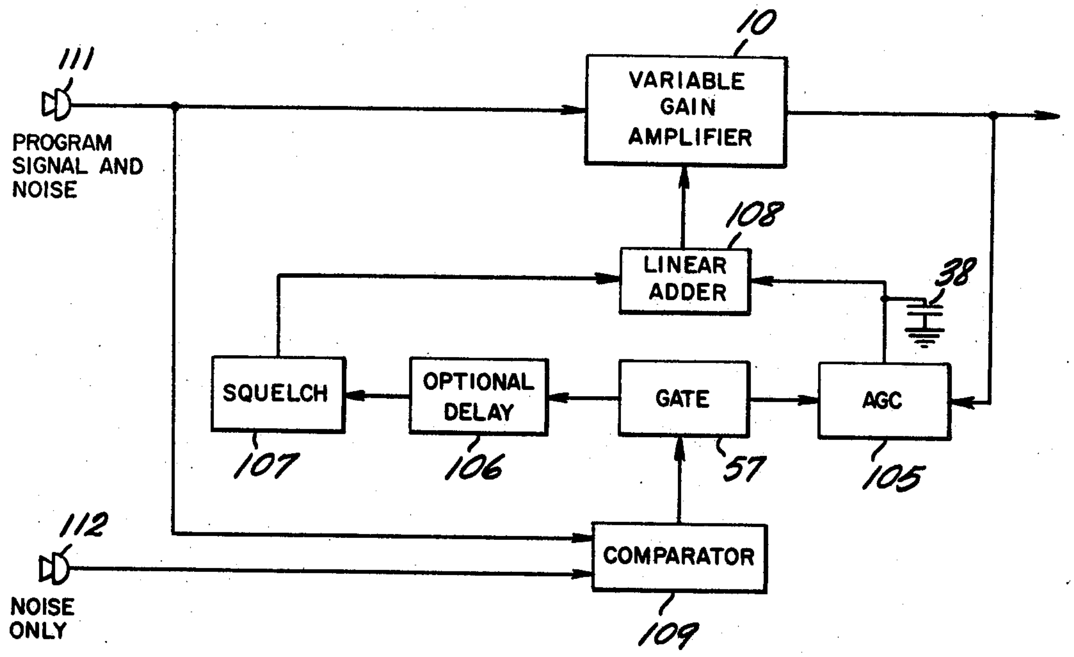
INVENTORS.
EMIL TORICK &
RICHARD G. ALLEN
BY
Brumbaugh, Free, Graves & Donohue
their ATTORNEYS.

United States Patent Office 3,496,481
Patented Feb. 17, 1970

3,496,481
AUTOMATIC GAIN CONTROL SYSTEM WITH NOISE VARIABLE THRESHOLD

Emil Torick, Darien, Conn., and Richard G. Allen, Pound Ridge, N.Y., assignors to Columbia Broadcasting System, Inc., New York, N.Y., a corporation of New York Filed Feb. 2, 1967, Ser. No. 613,547
Int. Cl. H03g *5/16*
U.S. Cl. 330—134 15 Claims

ABSTRACT OF THE DISCLOSURE

An AGC system wherein the amplifier gain is reduced to a minimum value when the program input ceases and returns immediately to previous gain level upon resumption of program signal. A voltage produced by both program signal and noise is compared with a voltage produced by noise only. When only noise is present, a substantial squelch voltage, in addition to the normal gain control voltage, is applied to the amplifier, minimizing the gain. The output of the gain control circuitry is maintained at the level reached immediately prior to the cessation of the program signal.

This invention relates to automatic gain control arrangements for amplifiers, and more particularly to a system which provides improved signal level control in audio amplifiers.

Various automatic gain control systems are known for minimizing the unpleasant effects of excess amplitude variations in an audio system. In its basic form, this is done by connecting the audio signal input to a variable gain amplifier, with a feedback loop connected from the output of the amplifier to the gain control terminal at the input. Thus, as the amplitude of the input signal increases, the feedback signal increases thereby reducing the amplified gain and, thus, reducing the output variation caused by the increase of the input audio signal.

Although such an elementary gain control produces a degree of improvement relative to a non-controlled system, it has been found that a further improvement in signal quality is obtainable if the system is arranged so that change in the amplitude of the audio signal does not affect the gain of the amplifier until the amplitude variation exceeds a predetermined amount. The range of amplitude variation in which it is desirable to maintain the gain of the system constant is called the "platform." The platform type of gain control has been found to produce audio reproductions significantly more pleasing to the human ear. The platform technique, and an apparatus for implementing it are fully described in Patent No. 3,260,957 entitled "Compensated Platform Gain Control Apparatus" and assigned to the present assignee.

The platform gain control arrangement of the aforementioned patent comprises a pair of feedback paths, each including a biassed rectifier circuit, such that a D.C. signal is not produced until the audio signal from the output of the controlled amplifier exceeds the bias level. The D.C. output of one of the feedback paths is applied to a storage capacitor which provides the control bias for the amplifier. The rectifier in the other feedback path is biassed to a different level whereby the same audio signal level produces a larger D.C. voltage.

The output of the second feedback path is coupled to the discharge path of the storage capacitor to prevent discharge of the latter until the audio signal level has decreased an amount sufficient to lower the second feedback output below the potential on the storage capacitor. Therefore, no change in the amplifier gain occurs until a predetermined signal drop occurs. This constant gain interval is called the "platform."

The system of the aforementioned Patent No. 3,260,957 also recognizes that it is not desirable to maintain constant gain in the face of signal variations which extend over a relatively long period of time, but do not exceed the platform levels. An example of this type of variation is the decrease in the amplitude of an audio signal due to a speaker's natural tendency to decrease his voice level from the time he takes a breath to the end of a sentence. To compensate for this, the circuit of the patent includes an auxiliary, slow discharge path for the storage element. The time constant of the auxiliary path is such that it will not respond to a sudden drop in the audio signal, but only to a signal gradually decreasing in amplitude over an extended period.

Another difficulty overcome by the automatic gain control system of the aforementioned patent is that resulting from prolonged periods of silence or very low amplitude input. Ordinarily during these periods, the automatic gain control would increase the gain of the amplifier to its maximum, and thereby cause undue amplification of any background noise or audience sounds which may be present.

This is avoided in the patented system by means of a gating circuit which switches when the audio input of the controlled amplifier falls below a threshold level. Upon switching, the gating circuit adjusts the charge on the storage capacitor to a level sufficient to lower the amplifier gain and avoid inordinate amplification of noise, effectively disabling the normal platform gain control. As soon as normal signal levels resume, the gate switches back to its original state and thereby enables the normal gain control.

The above technique for minimizing background noise transmission during prolonged pauses materially improves the overall quality of the audio program. However, in the presence of widely varying noise levels, the fixed threshold does not provide proper control. Furthermore, upon resumption of normal signal levels, return to the regular gain control operation must await a readjustment of the charge upon the storage capacitor and this delay can be annoying under certain signal conditions.

The present invention remedies both of the aforementioned problems, in the first instance by providing a variable threshold for the gating circuit which follows the noise levels, and in the second case, by isolating the gating circuit control of the amplifier gain from the gain control storage capacitor.

Accordingly, the primary object of the present invention is to improve the quality and clarity of the audio signals provided by the controlled amplifier, in a system which is compatible with automatic gain control circuitry of the platform type.

A further object of the present invention is to provide the means by which the gain of the variable gain amplifier is minimized during a pause in the program, regardless of the amplitude of the background noise signal.

A still further object of the present invention is to provide a means by which the gain of the variable gain amplifier is reduced during a program pause, without necessitating an unnecessarily long interval of time for the restoration of the gain after the resumption of the program signal.

Briefly, the present invention provides, in an automatic gain control system, an alternate source of gain control voltage which is connected to the controlled amplifier by means of a linear adder. Also connected to the linear adder is the regular gain control voltage from the storage capacitor. The aforementioned gating circuit turns the alternate voltage source "on" while it prevents the voltage across the storage capacitor from changing when the input to the amplifier consists only of noise, and it turns the alternate source "off" and enables the voltage across the storage capacitor to follow the signal from the output of the audio amplifier when the program resumes.

Control of the gating circuit is effected through the medium of a comparator circuit whose inputs are the entire audio signal, including audience and background noise, either continuous or discontinuous, and the audience and background noise alone. If a signal input is present, the comparator produces an output which commands the gating circuit to turn the alternate voltage source "off" thus leaving only the storage capacitor voltage to control the amplifier gain through the adder.

In the absence of a signal, but regardless of the level of the noise input, the potential across the comparator output is substantially zero and the gate is thereby commanded to activate the alternate voltage source and maintain the voltage across the storage capacitor. The output of the alternate source, which is selected to be of a magnitude that completely overrides the capacitor voltage, is then added to the capacitor voltage. The alternate voltage source thereby reduces the gain of the controlled amplifier when an input consists of noise only, regardless of the level of the noise. Moreover, since the alternate source is independent of the storage capacitor and the automatic gain control circuit, the capacitor charge can remain fixed while the gain of the controlled amplifier is reduced during a signal lapse. Consequently, at its conclusion, the amplifier gain is returned immediately to the level established prior to the lapse.

The aforementioned objects, features, and advantages of the present invention will become more apparent from the following detailed description thereof when taken in conjunction with the accompanying drawing, the single figure of which is a system diagram of an automatic gain control arrangement incorporating the present invention.

Referring now to the drawing, the system of the present invention includes a variable gain amplifier 10, automatic gain control circuitry 105, having a control voltage storage capacitor 38, and a gating circuit 57 which may be identical to those described in the aforementioned Patent No. 3,260,957, although the improvement is applicable to other forms of such circuitry. However, the voltage developed across the storage capacitor 38 of the AGC circuitry is not applied directly to the control terminal of the amplifier 10, but to a linear adder 108, whose output provides the controlling voltage.

The input to the gating circuitry 57 is derived, not simply from the amplifier input as in the aforementioned patent, but from a pair of audio sources illustrated as microphones 111 and 112. In a broadcast environment, for example, the microphone 111 would pick up both the audio program signal and audience and background noise, while the microphone 112 would be arranged to be responsive to the audience and background noise only.

The audio signals from the sources 111 and 112 are supplied as the two inputs to a comparator 109. In the absence of a program signal input, both microphones will pick up only the audience and background noise and the respective inputs to the comparator will be equal. The comparator consequently produces substantially zero potential at its output. During a program signal input, the comparator inputs are unbalanced and a non-zero comparator output potential is obtained. This potential, rather than the amplifier input signal as in the above noted patent, is applied to the gate input to control its operation.

The gating circuit 7 in turn controls an alternate bias signal source, shown as squelch 107, and provides a command which effectively enables or disables the automatic gain control circuitry. The input conditions of the gating circuit 57 determines which of two possible states are present at its output. When it is switched to its first state, the squelch 107 is turned "off" and the automatic gain control circuitry is enabled, while in its second state, the squelch is turned "on" and the automatic gain control circuitry is disabled.

The squelch circuit may be of any suitable type, e.g. a two-state switching circuit, which in one state provides a substantial D.C. level output of the proper polarity (when turned "on"), and in the other state provides an essentially zero level output. The gate circuit 57 may be coupled to the squelch 107 through a delay 106 designed so that the squelch is not turned "on" instantaneously upon the switching of the gate output to its second state, so that the system does not respond to momentary signal lapses, but is instantaneously turned "off" upon the switching of the gate back to its first state.

The squelch output is the second input to the linear adder 108. The D.C. level provided by the squelch when actuated is selected to be of the same polarity but substantially greater than the control voltages generated by the automatic gain control circuit 105, so that when both adder inputs are present, there always results a marked decrease in amplifier gain, e.g. to a predetermined minimum gain point.

As long as program signals at microphone 111 are present, a non-zero output is obtained from the comparator 109. This serves to maintain the output of gate 57 in its first binary state, thereby keeping the squelch "off." Control of the amplifier 10 is then dependent solely upon the potential developed by the automatic gain control 105, which then provides the total output of the adder.

Upon cessation of program signal input, the comparator output drops to zero because of the balanced inputs, thus switching the gate to its second state. The squelch is thus turned "on" (after a short delay if circuit 106 is utilized). A relatively large voltage is thereby applied to the adder, of a value sufficient of itself to drive the amplifier to its minimum gain operating point, and at the same time, a circuit condition is established in the AGC 105 to keep the voltage across the storage capacitor 38 at the level reached just prior to the signal lapse. The automatic gain control output, i.e. the voltage across the storage capacitor, is also applied to the adder at this time but is completely dominated by the squelch voltage.

Upon resumption of the program signal input, the squelch is turned "off," the automatic gain control circuitry 105 is enabled, and the only input to the adder is the potential across capacitor 38 of the automatic gain control. Since during the squelch, the voltage across the storage capacitor 38 does not respond to the decreased amplifier gain, but remains fixed, upon resumption of the signal input, the charge across the capacitor need not be readjusted for normal gain levels, which would take an undesirable length of time because of the relatively slow time constants involved. The normal amplifier gain is thereby restored immediately upon resumption of the program signal input, and the annoying signal level fluctuation which would otherwise occur is avoided.

It will also be recognized that the voltage that operates the squelch source 107 is not dependent upon a fixed or threshold level input to the amplifier, but rather only to the absence of a program signal input. Therefore, the squelch will operate to reduce the amplifier gain regardless of the audience or background noise level.

While the invention has been shown and described with reference to a preferred embodiment thereof, it will be understood to those skilled in the art that various modifications in form and details may be made therein without departing from the spirit and scope of the invention. For example, although for illustrative purposes, the system of the present invention is herein described as employed in an automatic gain control circuit of the platform type, specifically that shown in Patent No. 3,260,957, it is to be understood that the novel features may also be utilized with other forms of automatic gain control circuitry which does not provide the platform control. These and other modifications will become apparent to those skilled in the art.

We claim:

1. An automatic gain control system comprising a variable gain amplifier, first means for automatically controlling the gain of said amplifier when a program signal desired to be transmitted is present, and second means for disabling said first means when the said program signal ceases and for reducing the gain of said amplifier to a minimum upon the cessation of said program signal, said second means comprising means for comparing a composite signal, consisting of said program signal and a signal produced by background noise, with said background noise signal alone, thereby detecting the cessation of said program signal.

2. In a gain control system including an amplifier;
- automatic gain control means for generating a first signal that varies according to the output level of the amplifier,
- electrically responsive means for developing a control signal that alters the gain of the amplifier,
- means for comparing a composite signal consisting of a signal produced by a desired audio input and a signal produced by background noise, with said background noise signal alone, said comparing means producing an output signal which assumes a first state when said composite signal and said background noise signal are not equal, and a second state when said composite signal and said background noise signal are equal, and
- means for coupling said output signal to said electrically responsive means to override said first signal and change the gain of the amplifier in response to one of said states.

3. An audio frequency signal amplifying system, comprising:
- a variable gain amplifier,
- means for providing as the input to said amplifier audio frequency signals consisting of desired program signal components which may be of discontinuous nature and noise signals which may be continuous,
- means responsive to the output of said amplifier when said desired program components are present in said input audio signals to develop a first control potential which varies in dependence on the amplitude of said amplifier output, said amplifier output responsive means including storage means for retaining said first control potential irrespective of the variations in the level of noise signals, upon cessation of said program components,
- circuit means coupled to receive said audio frequency signals and responsive to the absence of program signal components to develop a second control potential of a fixed magnitude sufficient to reduce the gain of said amplifier to a minimum level for the duration of the absence of program signal components, and
- means for applying said first and second control signals to said amplifier to control the gain thereof.

4. An amplifying system according to claim 3 wherein said circuit means includes a potential source, comparator means, a first input for said comparator means to which are supplied said audio frequency signals, a second input for said comparator means to which are supplied said noise signals only, and means coupling said comparator means to said potential source to operate the latter to provide said second control potential only when both of said comparator means inputs are substantially equal.

5. An amplifying system according to claim 4 wherein said means coupling said comparator means to said potential source also couples said comparator means to said means responsive to the output of said amplifier to prevent said storage means from discharging when both of said comparator means inputs are substantially equal.

6. In an automatic gain control system for a variable gain amplifier having an input signal that may include desired signal components which may be discontinuous and undesired signal component which may be continuous:
- means responsive to the output signal of said amplifier, in the presence of a desired input signal component, for developing a first control potential whose value varies in relationship to said output signal level,
- a signal comparator,
- a first input channel for coupling said amplifier input signal to said comparator,
- a second input channel for coupling only said undesired signal components to said comparator,
- means coupled to said comparator for providing a predetermined potential output only in the presence of similar inputs to said comparator, whereby said predetermined potential is developed only during lapse of the said desired signal components,
- means for combining said first and predetermined potentials, and
- means for applying said combined potentials to said amplifier to control the gain thereof.

7. An automatic gain control system for a variable gain amplifier having an input signal that may include both a desired program signal component and an undesired noise signal component, comprising:
- means responsive to the output signal of the amplifier for developing a gain control signal whose value varies in accordance with the output signal level to control the gain of the amplifier;
- squelch means including means for comparing the amplifier input signal with a signal representative of the noise component only to develop a squelch signal in the absence of the desired program component; and
- means for applying the squelch signal to the amplifier to override the gain control signal and reduce the gain of the amplifier.

8. An automatic gain control system as defined in claim 7, in which the squelch means comprises:
- signal responsive squelch signal generating means to produce a squelch signal whose effect is large in comparison to the control signal; and
- gate means responsive to the comparing means for producing a signal to operate the squelch signal generating means in the absence of the desired program component.

9. An automatic gain control system according to claim 8, further comprising delay means between said gate means and said squelch signal generating means, whereby the latter does not generate a control voltage in response to very brief interruptions of said program signal.

10. An automatic gain control system according to claim 7, further comprising means responsive to said comparing means for rendering said gain control signal means unresponsive to the level of the amplifier output signal in the absence of the desired program signal component.

11. An automatic gain control system according to claim 7, in which said gain control signal means includes means for storing the gain control signal for a length of time exceeding the longest expected duration of the absence of the desired signal component when said means is unresponsive to the output signal of the amplifier.

12. A system according to claim 7 in which:
- the applying means includes linear adding means for combining the gain control and squelch signals to derive a combined control signal for application to the amplifier.

13. In an automatic gain control system having a variable gain amplifier for amplifying an input signal and a gain control circuit responsive to the amplifier output signal level for developing a gain control signal:
- gain control storage means for applying the gain control signal to the amplifier to retain said gain control signal at its immediately preceding value when the gain control circuit is disabled, and thereby to restore amplifier gain to its previous value when the gain control circuit is again operative;

squelch means responsive to a minimum level condition of the input signal for generating a squelch signal overriding the gain control signal on the storage means to reduce the amplifier gain; and means responsive to said minimum input signal condition for disabling the gain control circuit for the duration of such condition.

14. An automatic gain control system, comprising:

a variable gain amplifier having a signal input that may contain both a desired program signal and a noise signal, first circuit means coupled to the output of said amplifier for developing a control voltage to automatically control the gain of said amplifier in accordance with the desired program signal, and second circuit means for reducing the gain of said amplifier to a predetermined minimum upon cessation of said desired program signal and including squelch means responsive to said noise signals in the absence of desired program signals for developing a voltage having a magnitude large in camparison to the magnitude of said control voltage, means for adding the voltage provided by said squelch means to said control voltage, and means for connecting the output of said additive means to said variable gain amplifier to control the gain thereof.

15. An automatic gain control system, comprising:

a variable gain amplifier having a signal input that may contain both a desired program signal and a noise signal, first circuit means coupled to the output of said amplifier for developing a control voltage to automatically control the gain of said amplifier in accordance with the desired program signal, and second circuit means for reducing the gain of said amplifier to a predetermined minimum upon cessation of said desired program signals, said second circuit means comprising means for comparing said input signals with said noise signal alone to detect the cessation of said program signal to develop a squelch control signal, squelch means responsive to the squelch control signal for providing a voltage having a magnitude large in comparison to the magnitude of said control voltage, means for adding the voltage provided by the squelch means to said control voltage, and means for detecting the output of said additive means to said variable gain amplifier to control the gain thereof.

References Cited

UNITED STATES PATENTS

| | | | |
|---|---|---|---|
| 2,681,989 | 6/1954 | Cunniff | 325—478 X |
| 2,991,358 | 7/1961 | Wilcox | 325—475 X |
| 3,238,457 | 3/1966 | Boymel et al. | 325—474 X |
| 3,260,957 | 7/1966 | Kaiser et al. | 330—134 |

ROY LAKE, Primary Examiner

J. B. MULLINS, Assistant Examiner

U.S. Cl. X.R.

325—478; 330—141, 149

PO-1050
(5/69)

UNITED STATES PATENT OFFICE
CERTIFICATE OF CORRECTION

Patent No. 3,496,481 Dated February 17, 1970

Inventor(s) Emil Torick and Richard G. Allen

It is certified that error appears in the above-identified patent and that said Letters Patent are hereby corrected as shown below:

Col. 1, line 39, "amplified" should be --amplifier--; Col. 3, line 68, "7" should be --57--; Col. 6, line 1, "component" should be --components--; Col. 6, line 70, after "control" insert --signal--; Col. 8, line 8, "signals" should be --signal--.

SIGNED AND
SEALED
AUG 11 1970

(SEAL)
Attest:

Edward M. Fletcher, Jr.
Attesting Officer

WILLIAM E. SCHUYLER, JR.
Commissioner of Patents